US009941449B2

(12) United States Patent
Wada et al.

(10) Patent No.: US 9,941,449 B2
(45) Date of Patent: Apr. 10, 2018

(54) LIGHT EMITTING DEVICE

(71) Applicant: TOYODA GOSEI CO., LTD., Kiyosu-shi (JP)

(72) Inventors: Satoshi Wada, Kiyosu (JP); Kosei Fukui, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 69 days.

(21) Appl. No.: 14/625,384

(22) Filed: Feb. 18, 2015

(65) Prior Publication Data
US 2015/0263247 A1 Sep. 17, 2015

(30) Foreign Application Priority Data

Mar. 17, 2014 (JP) ................. 2014-053968

(51) Int. Cl.
*H01L 33/54* (2010.01)
*H01L 33/46* (2010.01)
*H01L 33/38* (2010.01)
*H01L 33/62* (2010.01)
*H01L 25/075* (2006.01)
*H01L 33/56* (2010.01)

(52) U.S. Cl.
CPC .............. *H01L 33/54* (2013.01); *H01L 33/62* (2013.01); *H01L 25/0753* (2013.01); *H01L 33/56* (2013.01); *H01L 2924/0002* (2013.01)

(58) Field of Classification Search
None
See application file for complete search history.

(56) References Cited

U.S. PATENT DOCUMENTS 6,392,294 B1 * 5/2002 Yamaguchi ......... H01L 23/3121
257/690
2012/0104452 A1 * 5/2012 Miyoshi .............. H01L 25/0753
257/99
2014/0239320 A1 8/2014 Miyoshi et al.

FOREIGN PATENT DOCUMENTS

JP 2012-099544 A 5/2012
JP 2012-099545 A 5/2012

* cited by examiner

Primary Examiner — Samuel Gebremariam
Assistant Examiner — Jonas T Beardsley
(74) Attorney, Agent, or Firm — McGinn I.P. Law Group, PLLC.

(57) ABSTRACT

A light emitting device includes: a substrate; an electrode pattern formed on the substrate; a light emitting element connected to the electrode pattern; a ridge-shaped resin covering portion which covers a part of the electrode pattern, and which includes a first and second outer edge portions; first and second through holes formed to penetrate through the electrode pattern such that the substrate is exposed; and first and second hole arrays including the first and second through holes arranged along the first and second outer edge portions, respectively. The first and second outer edge portions cover at least a part of the first and second through holes, respectively, and are bonded to the substrate in the first and second through holes, respectively.

13 Claims, 10 Drawing Sheets

LIGHT EMITTING DEVICE

CROSS-REFERENCE TO RELATED APPLICATIONS

This application claims the benefit of Japanese Patent Application No. 2014-053968 (filed on Mar. 17, 2014), the entire contents of which are incorporated herein by reference.

BACKGROUND

1. Technical Field

The present invention relates to a light emitting device and, more particularly, to a light emitting device including a resin covering portion which covers a part of an electrode pattern formed on a substrate.

2. Related Art

Patent Document 1 describes a light emitting apparatus including: an electrically insulating base member; a pair of electrically conductive pattern portions formed on an upper surface of the base member; a light emitting element electrically connected to the pair of electrically conductive pattern portions; and a resin portion that surrounds the light emitting element and partially covers the pair of electrically conductive pattern portions. Each of the pair of electrically conductive pattern portions extends toward a periphery of the base material from resin-covered parts covered by the resin. At least the resin-covered part of each of the pair of electrically conductive pattern portions has through holes. The through holes have an elongated shape extending in a direction in which the electrically conductive pattern portions such that a surface of the base material is exposed in the through holes. Both ends in a longitudinal direction of the through holes are exposed from the resin-covered part. Each of the electrically conductive pattern portions has a plurality of through holes. The through holes have a substantially rectangular shape with a longer side of the through holes extending in a direction in which the electrically conductive pattern portions extend.

Patent Document 1: JP-A-2012-99545

SUMMARY

The technique described in Patent Document 1 has the following problems.

(1) As a width (a length in the extension direction of the electrically conductive pattern portions) of the resin-covered part is increased, a length in a longitudinal direction of the through holes is increased, and the electrically conductive pattern portions located between the through holes are elongated. Accordingly, the electrical resistance of the electrically conductive pattern portions is increased.

(2) Both ends in a longitudinal direction of the through holes are exposed from the resin-covered part, and the through holes are arranged at equal intervals.

Therefore, high-strength portions (through hole forming portions) where a bonding strength of the base material and the resin covering portion is high and low-strength portions (portions located between the through holes) where a bonding strength of the base material and the resin covering portion is low are alternately arranged. Further, the stress generated by the thermal expansion of the resin-covered part is concentrated on the low-strength portions. Accordingly, the resin-covered part is liable to be separated from the base material in the low-strength portions.

(3) The through holes are arranged in a direction (shorter side direction) of the electrically conductive pattern portions perpendicular to the direction in which the electrically conductive pattern portions extend. The position the resin-covered part is deviated relative to the through holes in the shorter side direction. The through holes are placed only on one side portion in the shorter side direction of the resin-covered part.

Therefore, the balance of the stress generated by the thermal expansion of the resin-covered part is liable to be lost in the width direction of the resin-covered part. Accordingly, the resin-covered part is liable to be separated from the base material.

One or more aspects of the present invention have been made to solve the above problems, and an object thereof is to provide a light emitting device which can prevent the separation of the resin covering portion covering a part of an electrode pattern (a conductive pattern) and which can prevent an increase in an electrical resistance of the electrode patterns.

The present inventors have intensively studied in order to solve the above problems, and reached each aspect of the present invention as described below.

<First Aspect>

According to a first aspect, there is provided a light emitting device including: a substrate; an electrode pattern formed on the substrate; a light emitting element connected to the electrode pattern; a ridge-shaped resin covering portion which covers a part of the electrode pattern, and which includes a first outer edge portion and a second outer edge portion; a plurality of first through holes and a plurality of second through holes, which are formed to penetrate through the electrode pattern such that the substrate is exposed from bottoms of the first though holes and the second though holes; a first hole array including the first through holes arranged along the first outer edge portion; and a second hole array including the second through holes arranged along the second outer edge portion, wherein the first outer edge portion covers at least a part of each of the first through holes constituting the first hole array, and is bonded to the substrate in an inside of the first through holes, and wherein the second outer edge portion covers at least a part of each of the second through holes constituting the second hole array, and is bonded to the substrate in an inside of the second through holes.

In the first aspect, the first outer edge portion of the ridge-shaped resin covering portion is bonded to the substrate in the inside of the first through holes constituting the first hole array. Further, the second outer edge portion of the resin covering portion is bonded to the substrate in the inside of the second through holes constituting the second hole array.

Therefore, even when the adhesion between the resin covering portion and the electrode patterns is poor, it is possible to prevent the separation of the resin covering portion by the adhesion of the resin covering portion and the substrate.

Further, in the first aspect, the first through holes and the second through holes do not extend from the first outer edge portion to the second outer edge portion. Accordingly, it is possible to suppress an increase in the electrical resistance of the electrode patterns (conductive patterns) due to the formation of the through holes even when the width of the resin covering portion is increased.

Further, in the first aspect, the first outer edge portion of the ridge-shaped resin covering portion covers at least a part of each of the first through holes constituting the first hole array. Further, the second outer edge portion of the resin covering portion covers at least a part of each of the second through holes constituting the second hole array.

Therefore, high-strength portions (through hole forming portions) where a bonding strength of the substrate (base material) and the resin covering portion is high and low-strength portions (portions located between the through holes) where a bonding strength of the substrate and the resin covering portion is low are arranged in a distributed manner. Accordingly, the stress generated by the thermal expansion of the resin covering portion is not concentrated on the low-strength portions. As a result, it is possible to reliably prevent the separation of the resin covering portion.

Consequently, according to the first aspect, the width of the resin covering portion can be arbitrarily set. Accordingly, it is possible to increase a degree of freedom in design for the width of the resin covering portion.

Meanwhile, the size and shape of each of the first through holes and the second through holes may be different from each other.

That is, the size and shape of the first through holes and the second through holes may be changed. Further, the size and shape of each of the first through holes constituting the first hole array may be changed, or the size and shape of each of the second through holes constituting the second hole array may be changed.

<Second Aspect>

According to a second aspect, in the first aspect, the first through holes constituting the first hole array and the second through holes constituting the second hole array are alternately arranged with respect to an extension direction of the ridge-shaped resin covering portion.

In the second aspect, the stress generated by the thermal expansion of the resin covering portion is further distributed. Accordingly, it is possible to improve the effects and advantages of the first aspect.

Further, in the second aspect, even when the resin covering portion is separated from the first through holes or the second though holes at one of the first outer edge portion or the second outer edge portion of the resin covering portion, the resin covering portion is bonded to the substrate in the inside of the first through holes or the second through holes in the other of the first outer edge portion or the second outer edge portion. Accordingly, the progress of the separation of the resin covering portion can be stopped, so that the separation can be reliably prevented.

<Third Aspect>

According to a third aspect, in the first or second aspect, the first through holes constituting the first hole array and the second through holes constituting the second hole array are arranged at equal intervals in an extension direction of the ridge-shaped resin covering portion entirely.

In the third aspect, the balance of the stress generated by the thermal expansion of the resin covering portion is not lost in the extension direction of the ridge-shaped resin covering portion. As a result, it is possible to reliably prevent the separation of the resin covering portion.

<Fourth Aspect>

According to a fourth aspect, in any one of the first to third aspects, the resin covering portion includes a sealing frame which surrounds the light emitting element on the substrate.

<Fifth Aspect>

According to a fifth aspect, there is provided the light emitting device according to the fourth aspect, further including a reflective material with which a region surrounded by the sealing frame is filled so as to seal the light emitting element; and at least one third through hole formed to penetrate through the electrode pattern such that the substrate is exposed from a bottom of the third through hole, wherein the reflective material covers the third through hole, and is bonded to the substrate in an inside of the third through hole.

In the fifth aspect, the reflective material is bonded to the substrate in the inside of the third through holes. Accordingly, it is possible to prevent the separation of the reflective material even when the adhesion between the reflective material and the electrode patterns is poor.

<Sixth Aspect>

According to a sixth aspect, in any one of the first to fifth aspects, each of the through holes is a hole selected from a group consisting of a circular hole, an elliptical hole and a square hole.

DETAILED DESCRIPTION

Figure 1:
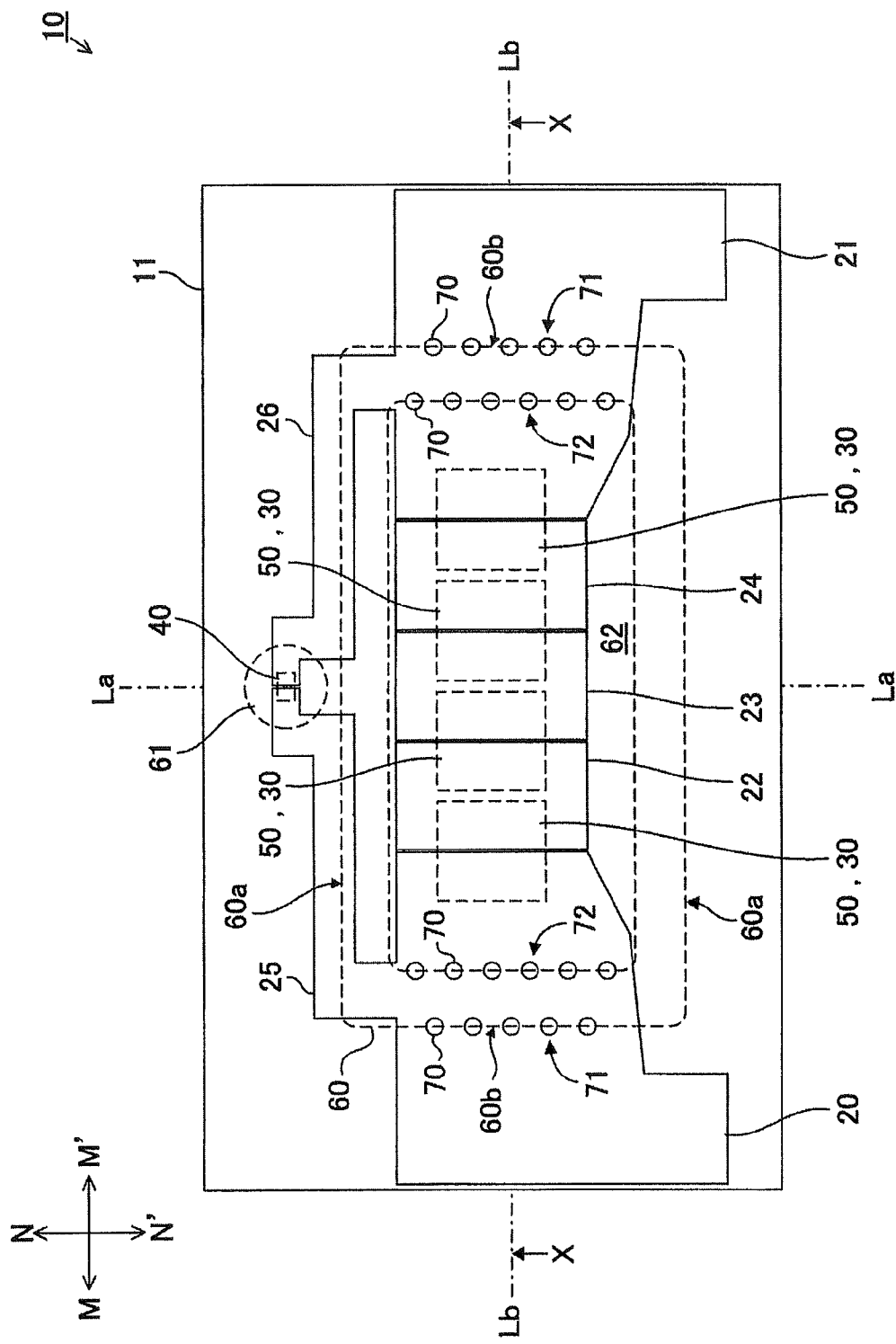
FIG. 1 is a partial perspective plan view of a light emitting device 10 of a first embodiment of the present invention.

Hereinafter, illustrative embodiments of the present invention will be described with reference to the drawings. In addition, in the illustrative embodiments, the same constituent parts and components are denoted by the same reference numerals and a duplicated description thereof will be omitted.

Further, in the drawings, in order to simplify the description, the size, shape and arrangement of the components in the illustrative embodiments are schematically shown in an exaggerated manner. In addition, the size, shape and arrangement of the components may be different from the actual.

First Embodiment

Figure 2:
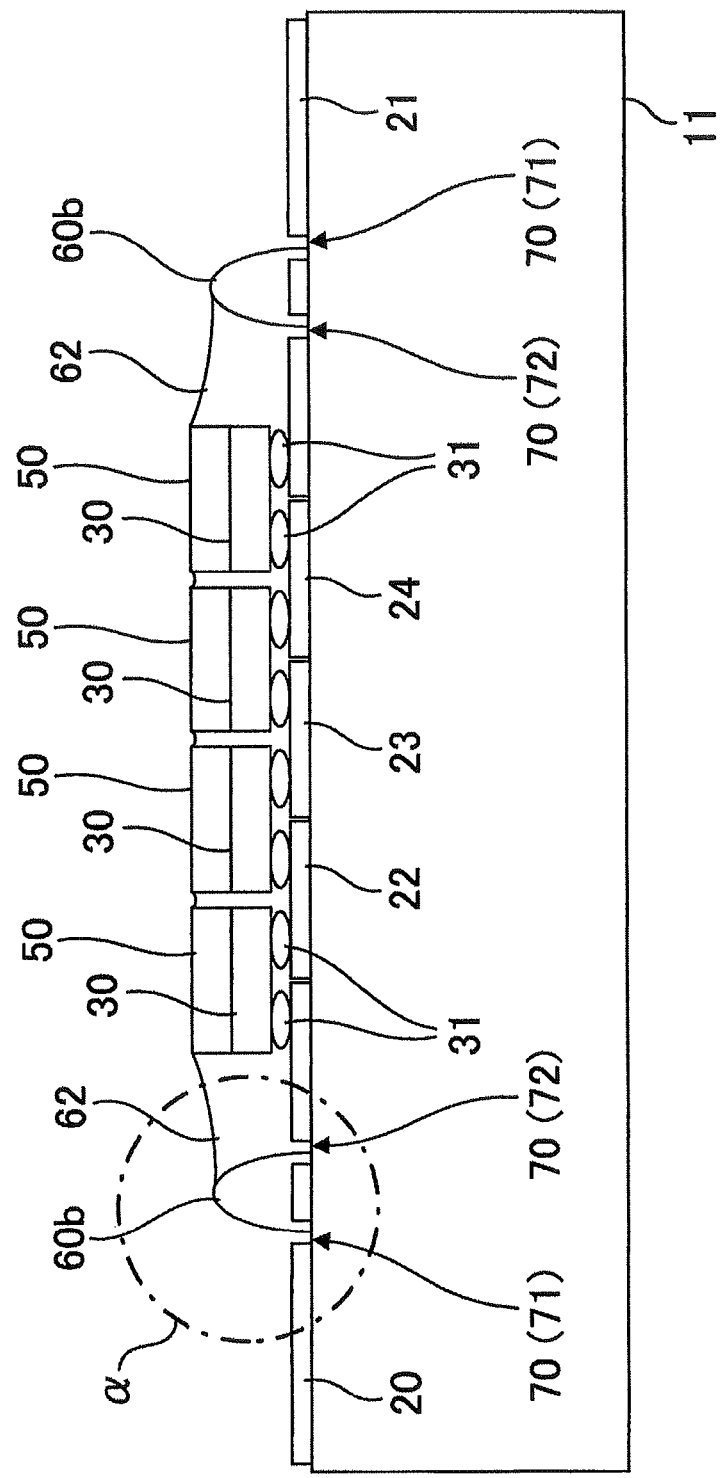
FIG. 2 is a longitudinal cross-sectional view of the light emitting device 10, taken along a direction of an arrow X-X shown in FIG. 1.
Figure 3:
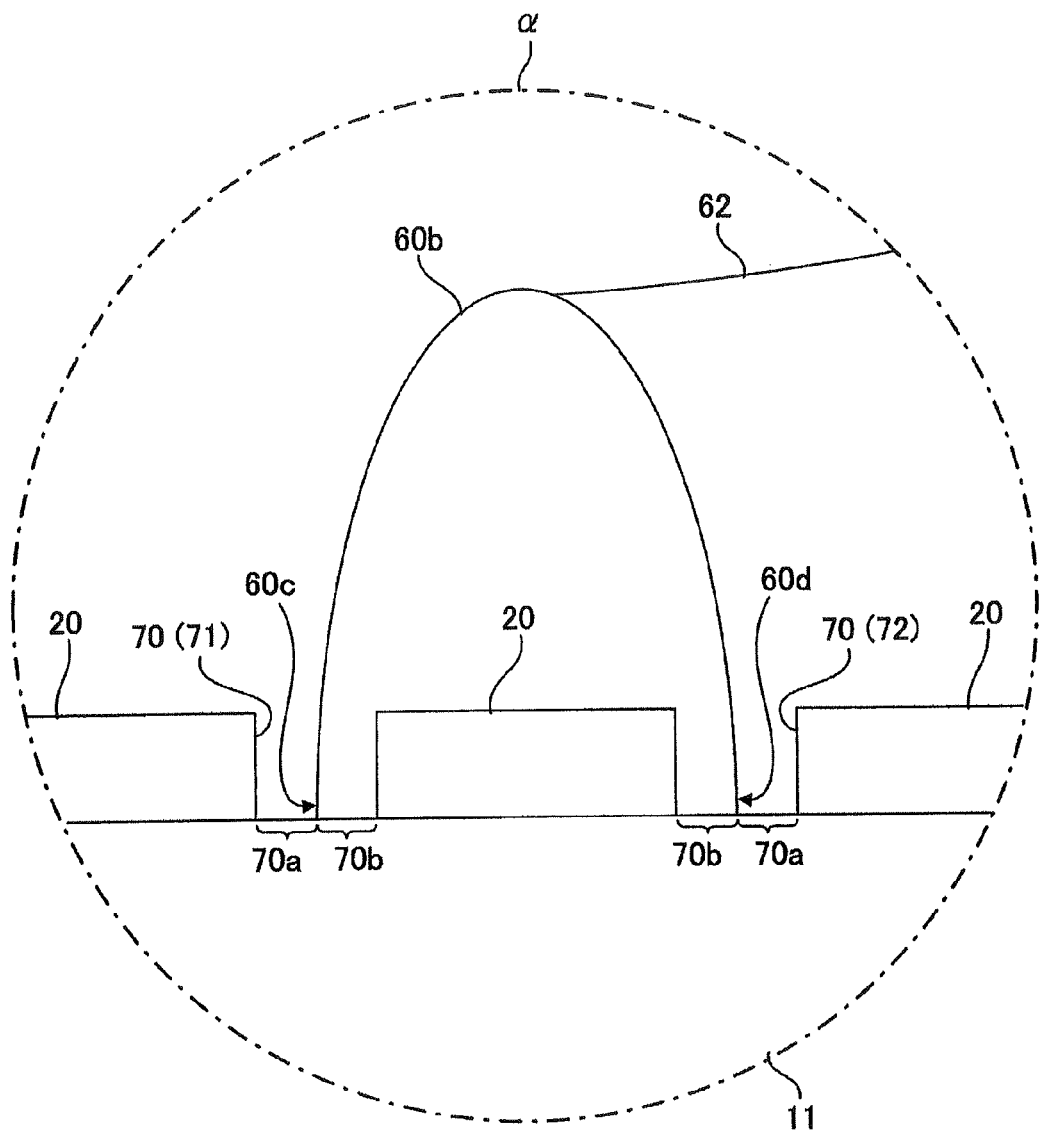
FIG. 3 is a longitudinal cross-sectional view of the light emitting device 10, showing an enlarged view of a main part "α" shown in FIG. 2.

As shown in FIG. 1 to FIG. 3, a light emitting device 10 of a first embodiment includes a substrate 11, electrode patterns 20 to 26, LED (Light Emitting Diode) chips 30, bumps 31, a zener diode 40, phosphor plates 50, a sealing frame 60 (a long side 60a, a short side 60b, an outer edge portion 60c, an inner edge portion 60d), a sealing material 61, a reflective material 62, through holes 70 (substantially semi-cylindrical portions 70a, 70b), hole arrays 71, 72 and the like.

The substrate (base material) 11 has a rectangular flat shape and is an insulating substrate made of an insulating material (e.g., aluminum nitride, etc.). The electrode patterns (conductive patterns or wiring patterns) 20 to 26 are made of a conductive layer (e.g., copper foil, etc.) formed on the substrate 11.

The electrode patterns 20 to 26 have a planar shape which is line-symmetric with respect to a center line La bisecting the substrate 11 in a longitudinal direction (see FIG. 1).

The electrode patterns 20, 21 extend toward an outer edge portion from the center of the substrate 11.

The electrode patterns 22 to 24 have a rectangular shape with the same size. The electrode patterns 22 to 24 are provided between the electrode patterns 20, 21 and arranged side by side in a row with a gap therebetween.

Base ends of the electrode patterns 25, 26 are connected integrally with the electrode patterns 20, 21, respectively. Leading ends of the electrode patterns 25, 26 are arranged to face each other with a gap therebetween.

The LED chips 30 and the zener diode 40 have a rectangular flat shape. An anode electrode pad and a cathode electrode pad (which are not shown) are formed on the same surface side of the LED chips 30 and the zener diode 40. The surface where these electrode pads are formed is a face-down element that is mounted/carried to the substrate 11.

The electrode pads are flip-chip bonded and connected to the electrode patterns 20 to 24 using the bumps 31. Accordingly, the LED chips 30 are mounted/carried on the substrate 11 in a state where the LED chips are arranged side by side in a row in an extension direction (a direction of an arrow M-M' shown in FIG. 1) of the electrode patterns 20, 21.

The electrode pads are flip-chip bonded and connected to the electrode patterns 25, 26 using bumps (not shown), so that the zener diode 40 is mounted/carried on the substrate 11.

Four LED chips 30 are connected in series through the electrode patterns 22 to 24 for the relay.

The zener diode 40 is connected in parallel to the four LED chips 30 connected in series through the electrode patterns 20, 21, 25, 26. The zener diode 40 functions as a protective element for the LED chips 30.

The phosphor plates 50 have a rectangular flat shape. The shape of the phosphor plates 50 is similar to that of the LED chips 30, as seen in a plan view. The phosphor plates 50 are fixed to the upper surfaces (light emitting surfaces) of the LED chips 30 by an adhesive (not shown).

The phosphor plates 50 are formed of a light-transmissive material (e.g., thermosetting resin material such as epoxy-based resin or silicon-based resin, inorganic material such as glass or ceramics, sol-gel glass, alumina, etc.). The light-transmissive material contains phosphors for changing the luminescent color by converting the wavelength of the emitted light of the LED chips 30.

The sealing frame (resin covering portion, resin frame or dam material) 60 is made of thermosetting resin material (e.g., epoxy-based resin, silicon-based resin, etc.) that contains light-reflective material (e.g., silicon oxide, titanium oxide, etc.).

The sealing frame 60 has a substantially rectangular frame shape with four round corners. The sealing frame 60 is arranged on the substrate 11 so as to surround the LED chips 30.

The long sides 60a of the sealing frame 60 have a ridge-shaped (linear) shape with a constant width. The long sides 60a are arranged along the extension direction (the direction of the arrow M-M' shown in FIG. 1) of the electrode patterns 20, 21.

The short sides 60b of the sealing frame 60 have a ridge shape with a constant width. The short sides 60b are arranged along a direction (a direction of an arrow N-N' shown in FIG. 1) which is substantially perpendicular to the extension direction (the direction of the arrow M-M') of the electrode patterns 20, 21.

The sealing material 61 is made of a thermosetting resin material.

The sealing material 61 has a hemispherical shape and is arranged on the substrate 11 so as to cover the zener diode 40.

The reflective material 62 is made of a thermosetting resin material that contains a light-reflective material. The reflective material 62 is injected/filled to a region surrounded by the sealing frame 60 and adapted to seal the LED chips 30 and the phosphor plates 50. The reflective material 62 covers the side surfaces of the LED chips 30 and the phosphor plates 50. Further, the reflective material 62 covers the surface of the substrate 11 and the electrode patterns 20 to 24 in the region surrounded by the sealing frame 60.

Figure 5A:
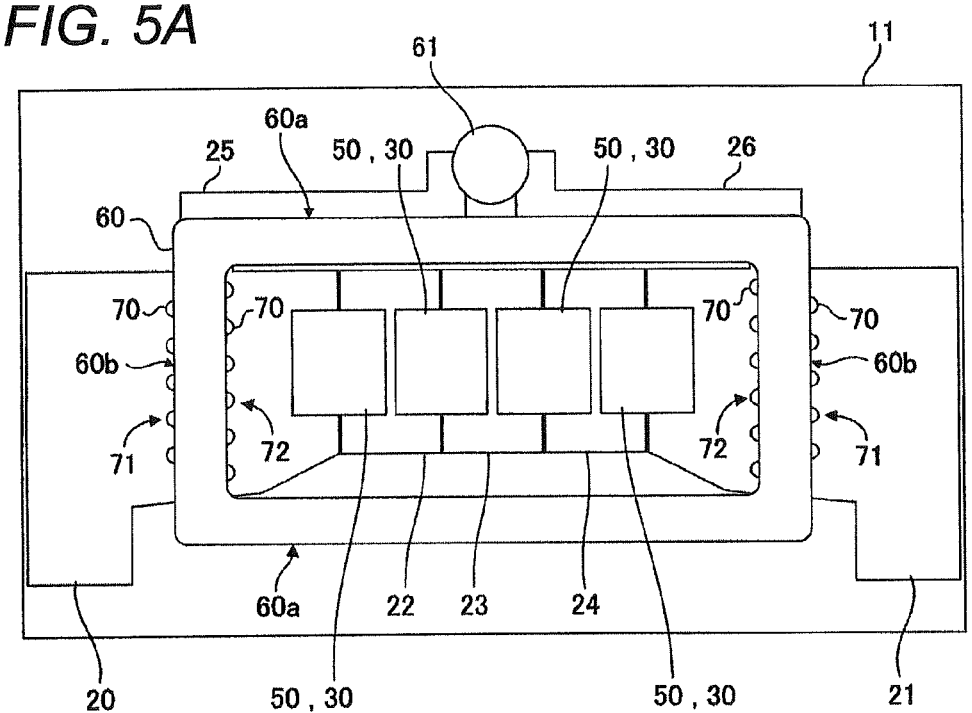
FIGS. 5A and 5B are plan views for explaining a method of manufacturing the light emitting device 10.
Figure 5B:
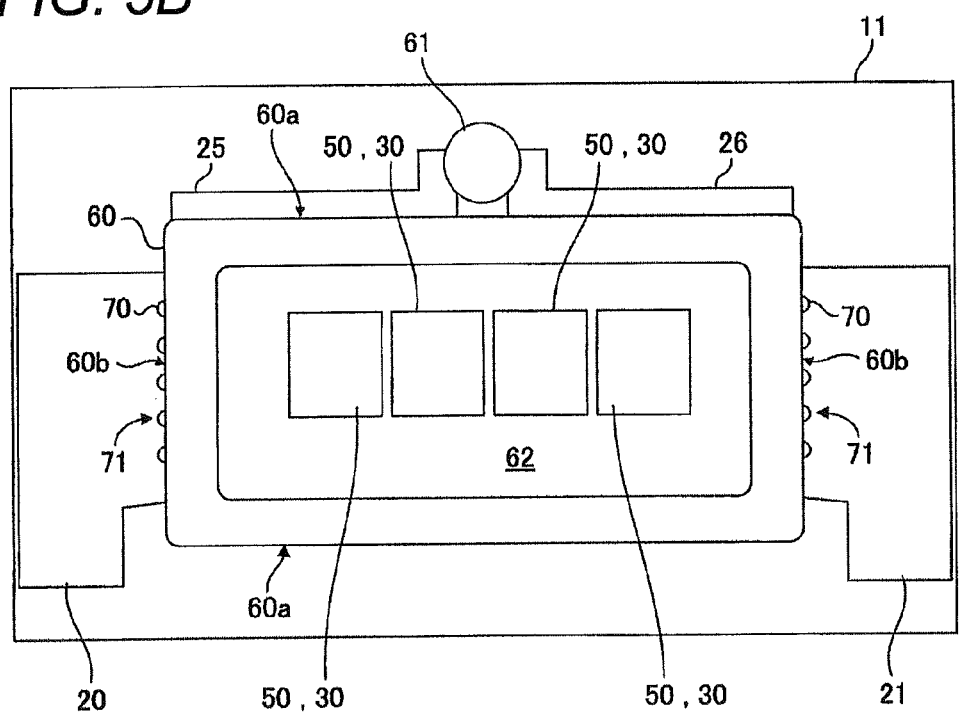

Meanwhile, the upper surfaces of the phosphor plates 50 are not covered by the reflective material 62 but exposed. Accordingly, the upper surfaces serve as the light emitting surfaces of the light emitting device 10 (see FIG. 5B).

The electrode patterns 20, 21 have a wider shape so as to reduce the electrical resistance.

The portions of the electrode patterns 20, 21, which are disposed on the outside of the sealing frame 60, are external electrodes of the light emitting device 10. Connection terminals (not shown) of an external power source are connected to the external electrodes, so that direct current from the external power source is supplied to the LED chips 30 and the zener diode 40 of the light emitting device 10.

The hole array (hole group) 71 is formed of five through holes 70 which are arranged in a row at equal intervals.

The hole array 72 is formed of six through holes 70 which are arranged in a row at equal intervals.

The hole arrays 71, 72 are arranged along the short sides 60b of the sealing frame 60.

Each of the holes arrays 71, 72 is arranged in parallel. The width (intervals between the centers of the through holes 70 constituting the hole arrays 71, 72) between the hole array 71 and the hole array 72 is substantially the same as the width of the short side 60b of the sealing frame 60.

That is, the centers of the through holes 70 constituting the hole array 71 are substantially matched to the outer edge portion 60c of the short side 60b of the sealing frame 60 (see FIG. 3).

Further, the centers of the through holes 70 constituting the hole array 72 are substantially matched to the inner edge portion 60d of the short side 60b of the sealing frame 60 (see FIG. 3).

The through holes 70 constituting the hole array 71 and the through holes 70 constituting the hole array 72 are alternately arranged with respect to the extension direction (the direction of the arrow N-N') of the short side 60b of the sealing frame 60.

That is, the centers of the through holes 70 constituting the hole array 71 and the centers of the through holes 70 constituting the hole array 72 are not arranged on the same straight line that is perpendicular to the extension direction (the direction of the arrow N-N') of the short side 60b of the sealing frame 60.

Further, the through holes 70 constituting each of the hole arrays 71, 72 are arranged in line-symmetry with respect to a center line Lb bisecting the short side 60b of the sealing frame 60 in the extension direction (the direction of the arrow N-N').

That is, the through holes 70 constituting each of the hole arrays 71, 72 are arranged at equal intervals on the entire extension direction (the direction of the arrow N-N') of the short side 60b of the sealing frame 60.

The circular through holes 70 (circular holes or annular holes) are through-formed in a thickness direction of the electrode patterns 20, 21. The surface of the substrate 11 is exposed from the bottom surfaces of the through holes 70.

As shown in FIG. 3, of the through holes 70 constituting the hole array 71, the substantially semi-cylindrical portion 70a is exposed from the outer edge portion 60c of the sealing frame 60 and the remaining substantially semi-cylindrical portion 70b is covered by the sealing frame 60. The sealing frame 60 is bonded to the surface of the substrate 11 in the inside of the substantially semi-cylindrical portions 70b.

As shown in FIG. 3, of the through holes 70 constituting the hole array 72, the substantially semi-cylindrical portion 70a is exposed from the inner edge portion 60d of the sealing frame 60 and the remaining substantially semi-cylindrical portion 70b is covered by the sealing frame 60. The sealing frame 60 is bonded to the surface of the substrate 11 in the inside of the substantially semi-cylindrical portion 70b. The reflective material 62 is bonded to the surface of the substrate 11 in the inside of the substantially semi-cylindrical portion 70a.

<Manufacturing Method of Light Emitting Device 10>

Figure 4A:
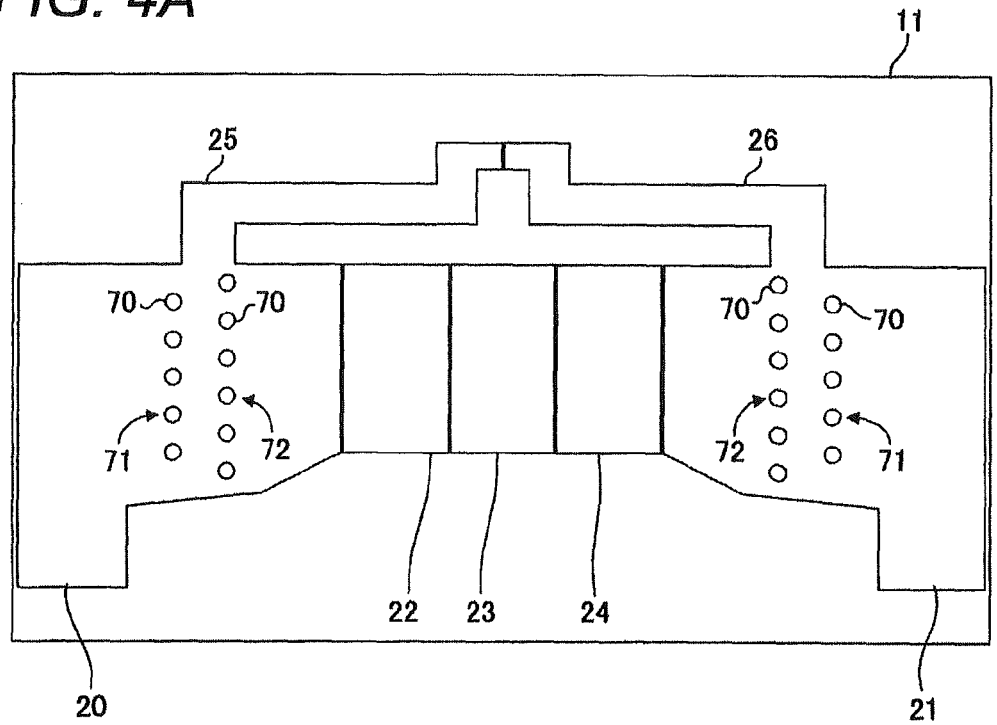
FIGS. 4A and 4B are plan views for explaining a method of manufacturing the light emitting device 10.

First process (see FIG. 4A): A photo-etching method or the like is used to form the electrode patterns 20 to 26 on the substrate 11. Simultaneously, the through holes 70 are formed in the electrode patterns 20, 21.

Figure 4B:
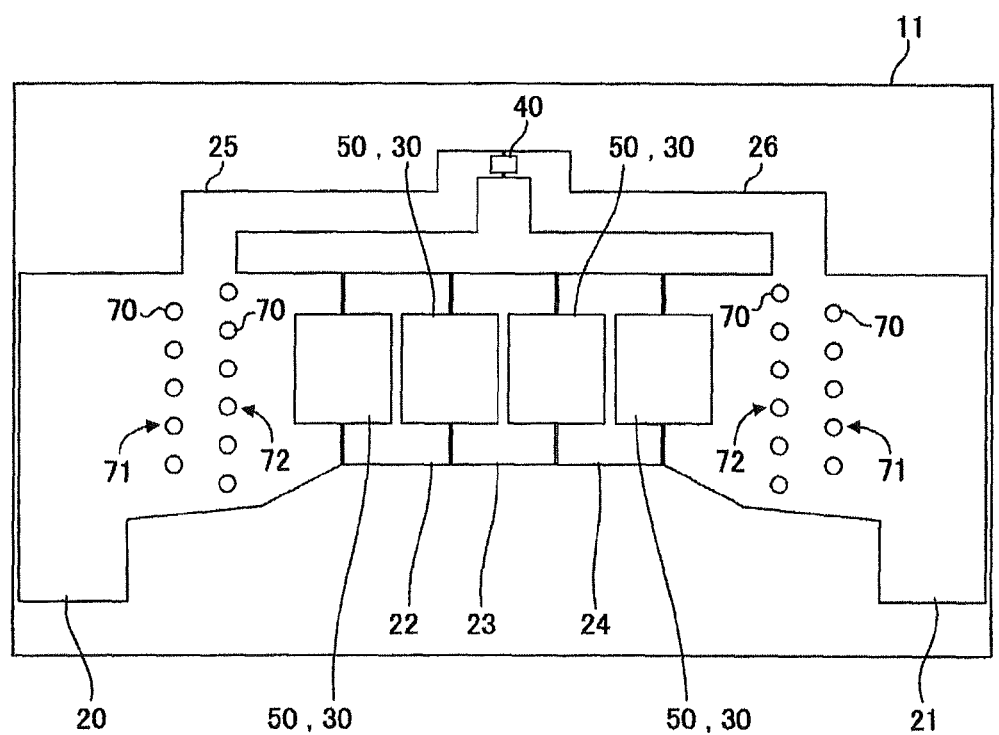

Second process (see FIG. 4B): The LED chips 30 having the phosphor plates 50 fixedly connected thereto are fixedly connected to the electrode patterns 20 to 24. In this way, the LED chips 30 are mounted/carried on the substrate 11.

Further, the zener diode 40 is fixedly connected to the electrode patterns 25, 26. In this way, the zener diode 40 is mounted/carried on the substrate 11.

Meanwhile, after the LED chips 30 are mounted/carried on the substrate 11, the phosphor plates 50 may be fixedly connected to the LED chips 30.

Third process (see FIG. 5A): A resin discharge method or the like is used to coat a thermosetting resin material having high viscosity on the substrate 11. Here, the thermosetting resin material having high viscosity is a material of forming the sealing frame 60 and the sealing material 61. Then, the thermosetting resin material is cured to form the sealing frame 60 and the sealing material 61.

Fourth process (see FIG. 5B): A resin discharge method or the like is used to inject/fill a thermosetting resin material having low viscosity in the region surrounded by the sealing frame 60. Here, the thermosetting resin material having low viscosity is a material of forming the reflective material 62. Then, the thermosetting resin material is cured to form the reflective material 62. In this way, the light emitting device 10 is completed.

Effects and Advantages of First Embodiment

According to the light emitting device 10 of the first embodiment, the following effects and advantages can be obtained.

(1) The light emitting device 10 includes the substrate 11, the electrode patterns 20, 21 formed on the substrate 11, the LED chips 30 (light emitting elements) connected to the electrode patterns 20, 21, the short side 60b (ridge-shaped resin covering portion) of the sealing frame 60 covering a part of the electrode patterns 20, 21 and having the outer edge portion 60c (first outer edge portion) and the inner edge portion 60d (second outer edge portion), the through holes 70 (first through holes) formed through the electrode pattern 20, 21 and causing the substrate 11 to be exposed from the bottom surface thereof, the hole array 71 (first hole array) formed by the five through holes 70 which are arranged along the outer edge portion 60c, and the hole array 72 (second hold array) formed by the six through holes 70 which are arranged along the inner edge portion 60d.

The outer edge portion 60c of the short side 60b of the sealing frame 60 covers at least a part of the through holes 70 constituting the hole array 71 and bonded to the substrate 11 in the inside of the through holes 70.

The inner edge portion 60d of the short side 60b of the sealing frame 60 covers at least a part of the through holes 70 constituting the hole array 72 and bonded to the substrate 11 in the inside of the through holes 70.

In the light emitting device 10, the outer edge portion 60c of the short side 60b of the sealing frame 60 is bonded to the substrate 11 in the inside of the through holes 70 constituting the hole array 71. Further, the inner edge portion 60d of the short side 60b of the sealing frame 60 is bonded to the substrate 11 in the inside of the through holes 70 constituting the hole array 72.

Therefore, even when the adhesion between the sealing frame 60 and the electrode patterns 20, 21 is poor, it is possible to prevent the separation of the short side 60b of the sealing frame 60 by the adhesion of the short side 60b of the sealing frame 60 and the substrate 11.

Meanwhile, a hole diameter (inner diameter) of the through holes 70 may be appropriately set so that the sealing frame 60 can be reliably brought into contact with the surface of the substrate 11 in the inside of the substantially semi-cylindrical portion 70b.

Further, in the light emitting device 10, the through holes 70 do not extend from the outer edge portion 60c to the inner edge portion 60d in the short side 60b of the sealing frame 60. Accordingly, it is possible to suppress an increase in the electrical resistance of the electrode patterns 20, 21 (conductive patterns) due to the formation of the through holes 70 even when the width of the short side 60b of the sealing frame 60 is increased.

Further, in the light emitting device 10, the outer edge portion 60c of the short side 60b of the sealing frame 60 covers at least a part of the through holes 70 constituting the hole array 71. Further, the inner edge portion 60d of the short side 60b of the sealing frame 60 covers at least a part of the through holes 70 constituting the hole array 72.

Therefore, high-strength portions (through hole forming portions) where the bonding strength of the substrate 11 (base material) and the short side 60b of the sealing frame 60 is high and low-strength portions (portions located between the through holes 70) where the bonding strength of the substrate 11 and the short side 60b of the sealing frame 60 is low are arranged in a distributed manner. Accordingly, the stress generated by the thermal expansion of the short side 60b of the sealing frame 60 is not concentrated on the low-strength portion. As a result, it is possible to reliably prevent the separation of the short side 60b of the sealing frame 60.

Consequently, according to the light emitting device 10, the width of the short side 60*b* of the sealing frame 60 can be arbitrarily set. Accordingly, it is possible to increase a degree of freedom in design for the width of the short side 60*b* of the sealing frame 60.

(2) The through holes 70 constituting the hole array 71 and the through holes 70 constituting the hole array 72 are alternately arranged with respect to the extension direction of the short side 60*b* of the sealing frame 60.

Therefore, as seen in a vertical cross-section cut along the extension direction of the short side 60*b* of the sealing frame 60, it is possible to increase the ratio of the portion of the sealing frame 60 located inside the through holes 70 of the hole arrays 71, 72.

Thereby, since the stress generated by the thermal expansion of the short side 60*b* of the sealing frame 60 is further distributed, it is possible to improve the effects and advantages of the (1).

Further, in the case where the through holes 70 are large-diameter holes that extend from the outer edge portion 60*c* to the inner edge portion 60*d* of the short side 60*b* of the sealing frame 60, there is a possibility that the separation becomes a crack-like form and progresses to the entire through holes 70 when the sealing frame 60 is separated in a part of the through holes 70.

However, according to the light emitting device 10, even when a part of the sealing frame 60 is separated from the through holes 70 at one of the outer edge portion 60*c* or the inner edge portion 60*d* of the short side 60*b* of the sealing frame 60, the sealing frame 60 is bonded to the substrate 11 in the inside of the through holes 70 in the other of the outer edge portion 60*c* or the inner edge portion 60*d*. Accordingly, the progress of the separation of the short side 60*b* of the sealing frame 60 can be stopped, so that the separation can be reliably prevented.

(3) The through holes 70 constituting each of the hole arrays 71, 72 are arranged at equal intervals in the entire extending direction (the direction of the arrow N-N') of the short side 60*b* of the sealing frame 60.

Therefore, the balance of the stress generated by the thermal expansion of the short side 60*b* of the sealing frame 60 is not lost in the extension direction of the short side 60*b* of the sealing frame 60. As a result, it is possible to reliably prevent the separation of the short side 60*b* of the sealing frame 60.

Second Embodiment

Figure 6:
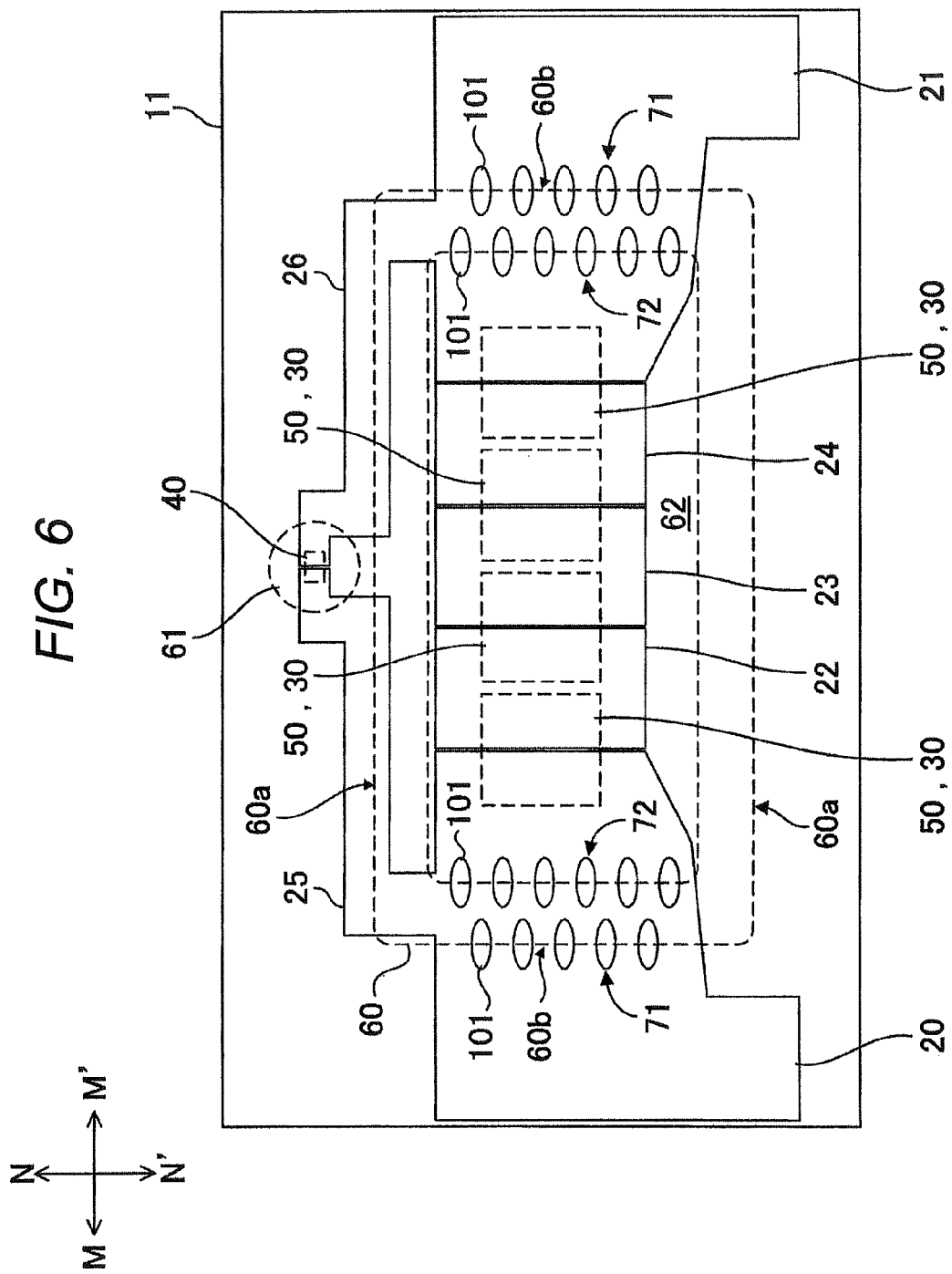
FIG. 6 is a partial perspective plan view of a light emitting device 100 of a second embodiment of the present invention.

As shown in FIG. 6, a light emitting device 100 of a second embodiment includes the substrate 11, the electrode patterns 20 to 26, the LED chips 30, the bumps 31, the zener diode 40, the phosphor plates 50, the sealing frame 60, the sealing material 61, the reflective material 62, the hole arrays 71, 72, through-holes 101 and the like.

The light emitting device 100 of the second embodiment is different from the light emitting device 10 of the first embodiment in that the through holes 70 of the light emitting device 10 are replaced by the through holes 101.

The elliptical through holes (elliptical holes) 101 have a major axis that is arranged along an extension direction (the direction of the arrow M-M') of the long side 60*a* of the sealing frame 60.

In the light emitting device 100 of the second embodiment, the area of the bottom surface of the elliptical through holes 101 is greater than that of the bottom surface of the circular through holes 70 in the light emitting device 10 of the first embodiment. Accordingly, the bonding area between the sealing frame 60 and the substrate 11 in the inside of the through holes 101 is increased. As a result, the bonding strength can be further increased, as compared to the first embodiment, so that it is possible to reliably prevent the separation of the short side 60*b* of the sealing frame 60.

Third Embodiment

Figure 7:
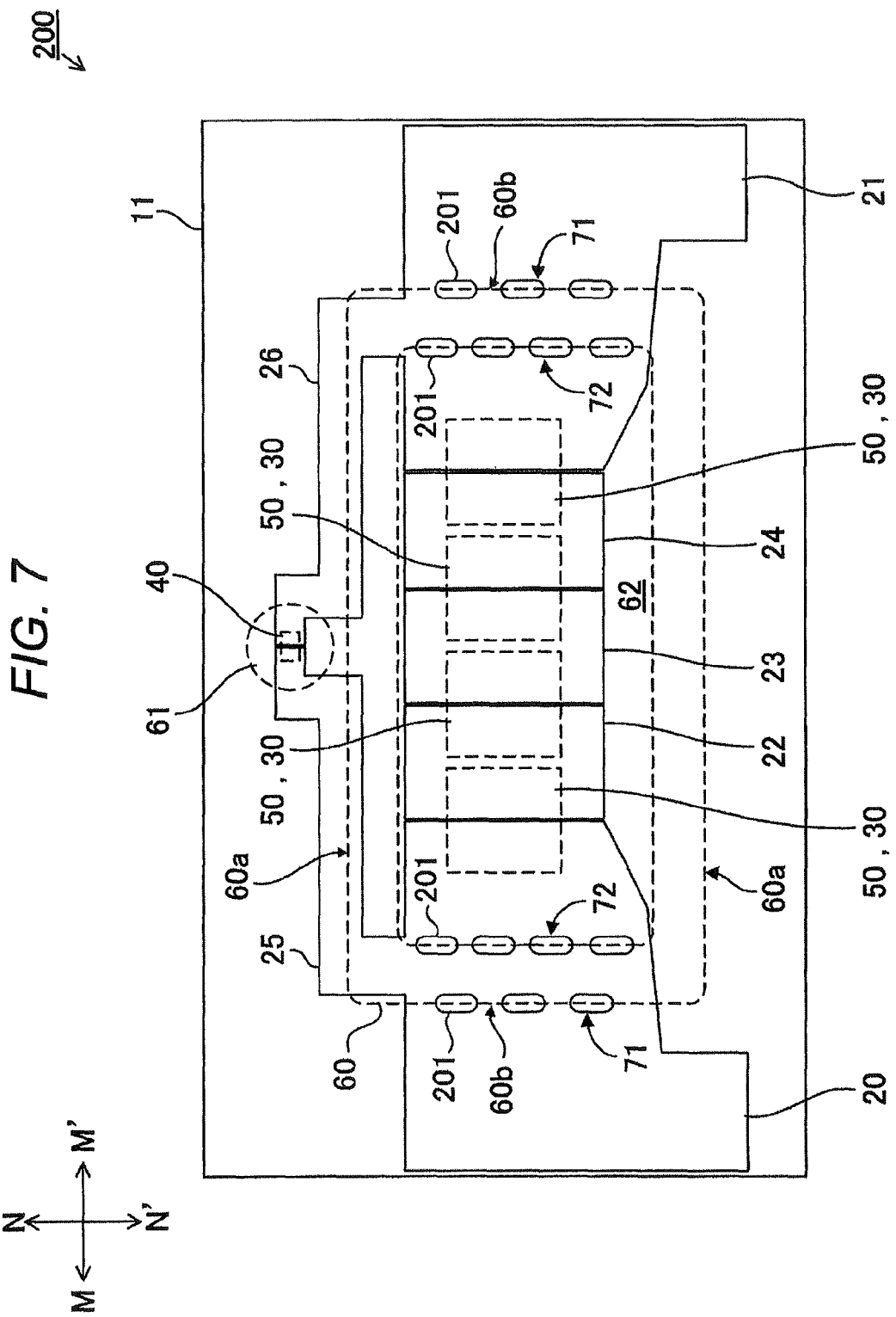
FIG. 7 is a partial perspective plan view of a light emitting device 200 of a third embodiment of the present invention.

As shown in FIG. 7, a light emitting device 200 of a third embodiment includes the substrate 11, the electrode patterns 20 to 26, the LED chips 30, the bumps 31, the zener diode 40, the phosphor plates 50, the sealing frame 60, the sealing material 61, the reflective material 62, the hole arrays 71, 72, through-holes 201 and the like.

The light emitting device 200 of the third embodiment is different from the light emitting device 10 of the first embodiment in that the through holes 70 of the light emitting device 10 are replaced by the through holes 201.

The elliptical through holes 201 have a major axis that is arranged along the extension direction (the direction of the arrow N-N') of the short side 60*b* of the sealing frame 60. The through holes 201 are formed to have a long diameter that is greater than intervals between through holes 201.

In the light emitting device 200 of the third embodiment, the area of the bottom surface of the elliptical through holes 201 is greater than that of the bottom surface of the circular through holes 70 in the light emitting device 10 of the first embodiment. Accordingly, the bonding area between the sealing frame 60 and the substrate 11 in the inside of the through holes 201 is increased. As a result, the bonding strength can be further increased, as compared to the first embodiment, so that it is possible to reliably prevent the separation of the short side 60*b* of the sealing frame 60.

Furthermore, the outer edge portion 60*c* and the inner edge portion 60*d* of the short side 60*b* of the sealing frame 60 are located along the major axis of the through holes 201 and the length of the through holes 201 along the outer edge portion 60*c* and the inner edge portion 60*d* can be increased. Accordingly, it is possible to effectively suppress the separation of the sealing frame 60 from the outer edge portion 60*c* or the inner edge portion 60*d*, which is a boundary of the bonding region between the sealing frame 60 and the substrate 11.

Further, the through holes 201 constituting the hole array 71 and the through holes 201 constituting the hole array 72 are alternately arranged with respect to the extension direction of the short side 60*b* of the sealing frame 60.

Therefore, as seen in a vertical cross-section cut along the extension direction of the short side 60*b* of the sealing frame 60, the long diameter of each of the through holes 201 is greater than intervals between through holes 201. Accordingly, a part of the sealing frame 60 is always located in the inside of the through holes 201 of each of the hole arrays 71, 72. As a result, the bonding strength of the sealing frame 60 and the substrate 11 can be improved, so that it is possible to reliably prevent the separation of the sealing frame 60.

Further, in the light emitting device 200 of the third embodiment, the length (length of a minor axis of the through holes 201) in the extension direction (the direction of the arrow M-M') of the electrode patterns 20, 21 in the through holes 201 is shorter than the length (length of the major axis of the through holes 201) in the extension direction of the electrode patterns 20, 21 in the through holes 101 of the second embodiment.

Therefore, in the third embodiment, similarly to the first embodiment, it is possible to suppress an increase in the electrical resistance of the electrode patterns 20, 21, as compared to the second embodiment.

Fourth Embodiment

Figure 8:
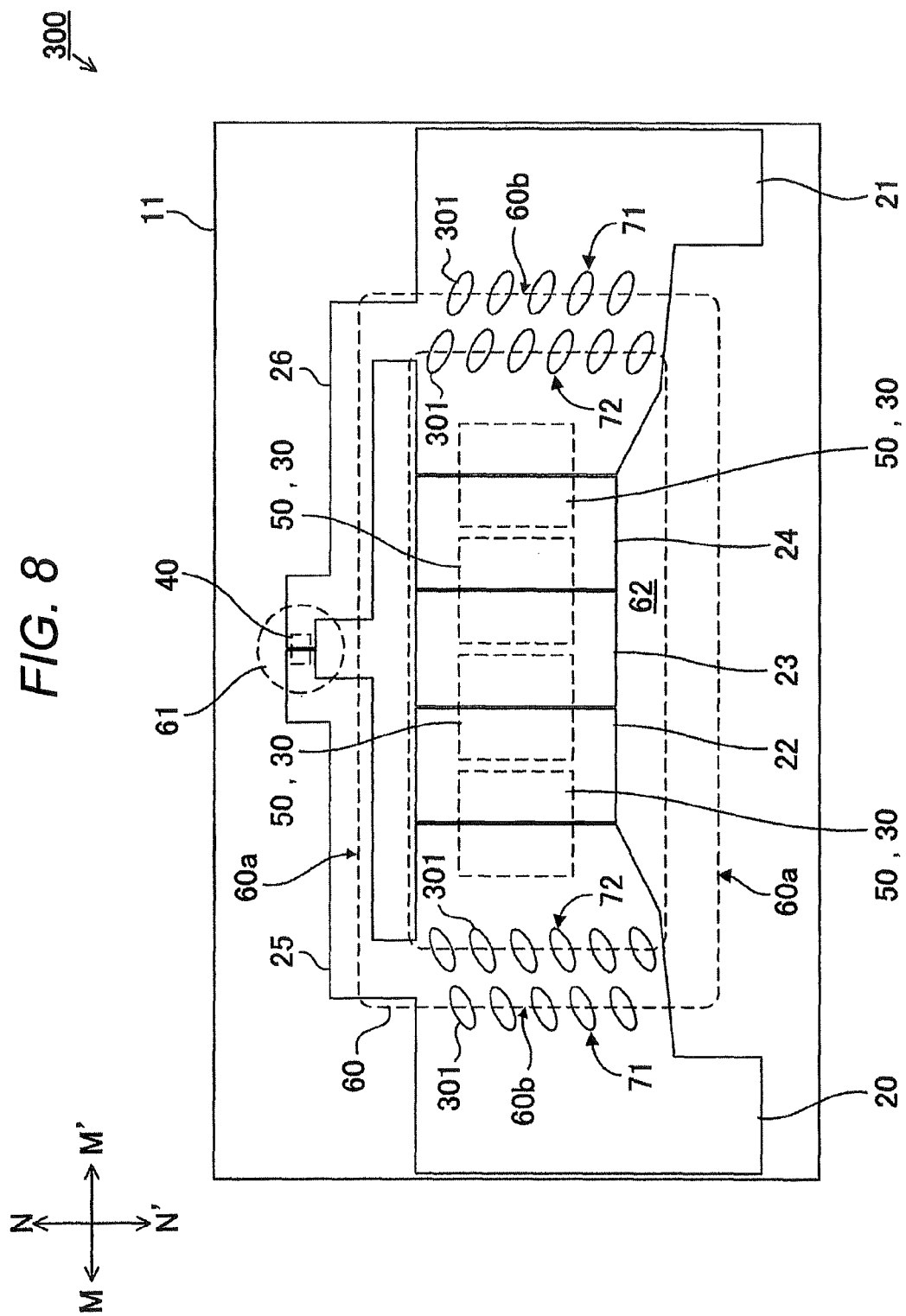
FIG. 8 is a partial perspective plan view of a light emitting device 300 of a fourth embodiment of the present invention.

As shown in FIG. 8, a light emitting device 300 of a fourth embodiment includes the substrate 11, the electrode patterns 20 to 26, the LED chips 30, the bumps 31, the zener diode 40, the phosphor plates 50, the sealing frame 60, the sealing material 61, the reflective material 62, the hole arrays 71, 72, through-holes 301 and the like.

The light emitting device 300 of the fourth embodiment is different from the light emitting device 10 of the first embodiment in that the through holes 70 of the light emitting device 10 are replaced by the through holes 301.

The elliptical through holes 301 have a major axis that is arranged at an acute angle with respect to the extension direction of the short side 60b of the sealing frame 60.

Therefore, in the fourth embodiment, it is possible to obtain the same effects and advantages as the second embodiment or the third embodiment.

Fifth Embodiment

Figure 9:
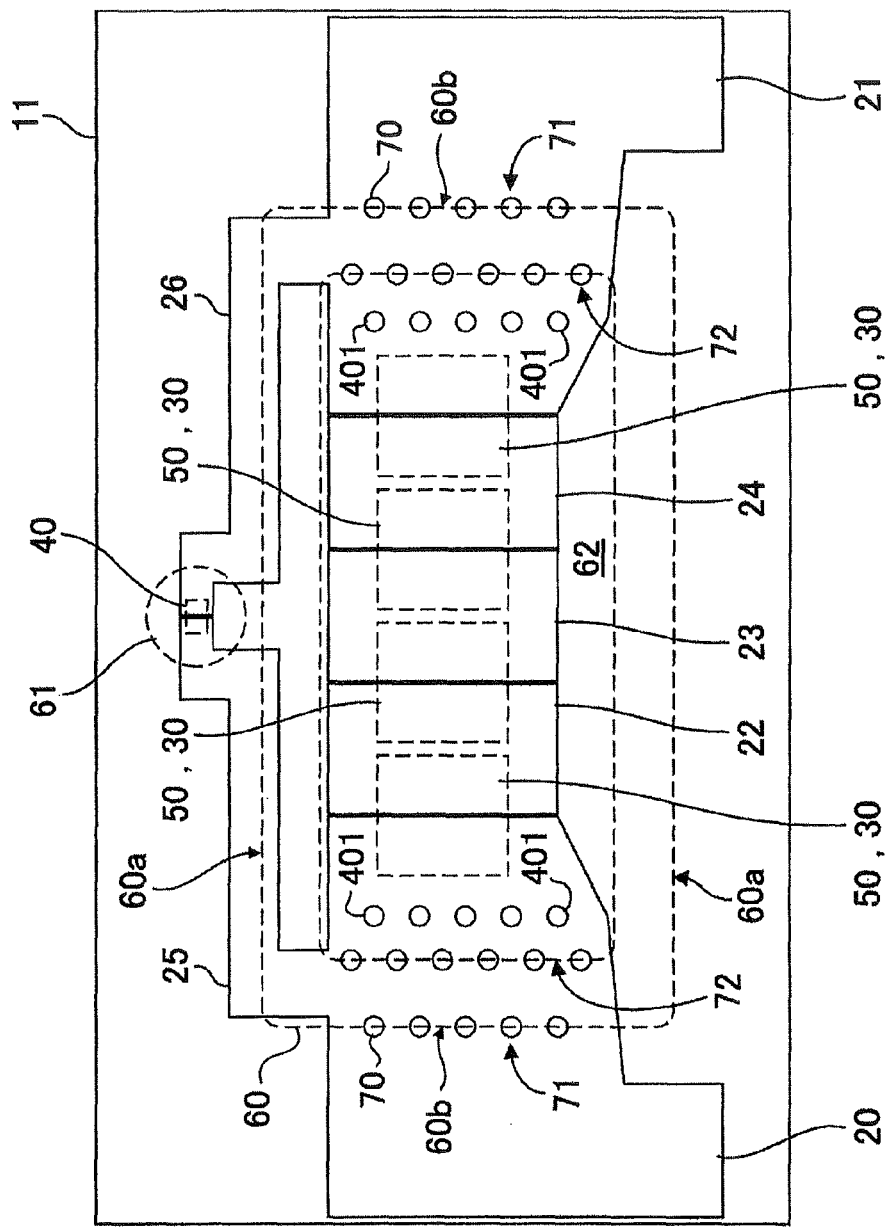
FIG. 9 is a partial perspective plan view of a light emitting device 400 of a fifth embodiment of the present invention.

As shown in FIG. 9, a light emitting device 400 of a fifth embodiment includes the substrate 11, the electrode patterns 20 to 26, the LED chips 30, the bumps 31, the zener diode 40, the phosphor plates 50, the sealing frame 60, the sealing material 61, the reflective material 62, the hole arrays 71, 72, through-holes 70, 401 and the like.

The light emitting device 400 of the fifth embodiment is different from the light emitting device 10 of the first embodiment in that the through holes 401 are additionally provided.

The circular through holes 401 are through-formed in the thickness direction of the electrode patterns 20, 21. The surface of the substrate 11 is exposed from the bottom surface of the through holes 401.

The through holes 401 are arranged in the electrode patterns 20, 21 and between the hole array 72 and the LED chips 30.

The reflective material 62 covers the entire through holes 401. The reflective material 62 is bonded to the surface of the substrate 11 in the inside of the through holes 401.

In the light emitting device 400 of the fifth embodiment, the reflective material 62 is bonded to the surface of the substrate 11 in the inside of the through holes 401 (second though holes). Accordingly, it is possible to prevent the separation of the reflective material 62 even when the adhesion between the reflective material 62 and the electrode patterns 20, 21 is poor.

Meanwhile, in the example shown in FIG. 9, five through holes 401 are arranged along the extension direction of the short side 60b of the sealing frame 60. However, the present invention is not limited thereto. The number and arrangement places of the through holes 401 may be set as appropriate.

Sixth Embodiment

Figure 10:
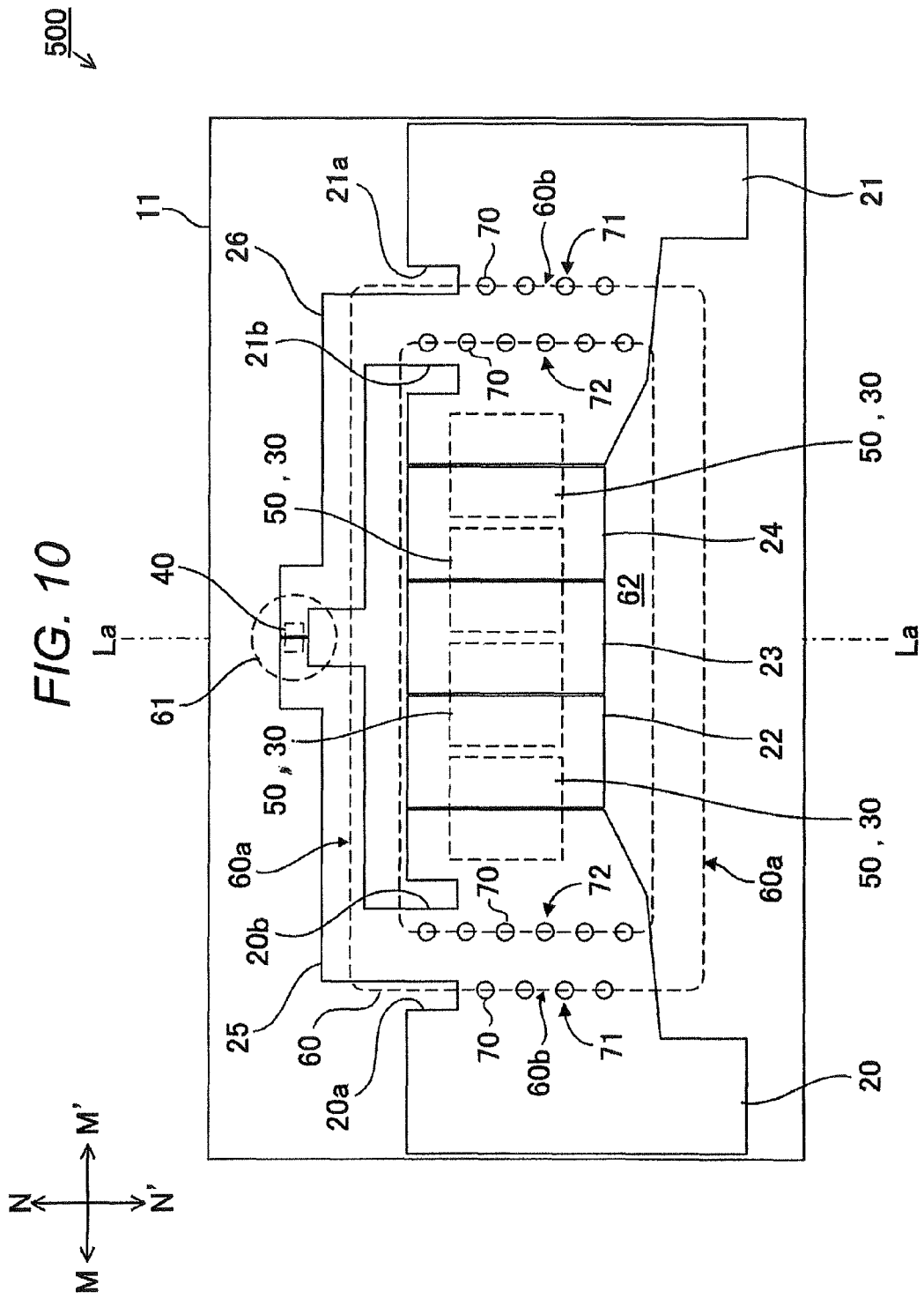
FIG. 10 is a partial perspective plan view of a light emitting device 500 of a sixth embodiment of the present invention.

As shown in FIG. 10, a light emitting device 500 of a sixth embodiment includes the substrate 11, the electrode patterns 20 to 26, the LED chips 30, the bumps 31, the zener diode 40, the phosphor plates 50, the sealing frame 60, the sealing material 61, the reflective material 62, the through holes 70, the hole arrays 71, 72, cut-out portions 20a, 20b, 21a, 21b of the electrode patterns 20, 21 and the like.

The light emitting device 500 of the sixth embodiment is different from the light emitting device 10 of the first embodiment in that the cut-out portions 20a, 20b, 21a, 21b of the electrode patterns 20, 21 are additionally provided.

The cut-out portions 20a, 20b, 21a, 21b are formed by rectangular recesses. The rectangular recesses are cut out in the electrode patterns 20, 21 so as to extend in a direction that is substantially perpendicular to the extension direction (the direction of the arrow M-M') of the electrode patterns 20, 21.

The cutout portions 20a, 21a are arranged to be matched to the outer edge portion of the short side 60b of the sealing frame 60. The sealing frame 60 and the surface of the substrate 11 are bonded in the cutout portions 20a, 21a.

The cutout portions 20b, 21b are arranged between the hole array 72 and the LED chips 30. The reflective material 62 and the surface of the substrate 11 are bonded in the cutout portions 20b, 21b.

In the light emitting device 500 of the sixth embodiment, the sealing frame 60 and the surface of the substrate 11 are bonded in the cutout portions 20a, 21a. Accordingly, it is possible to prevent the separation of the short side 60b of the sealing frame 60 even when the adhesion between the sealing frame 60 and the electrode patterns 20, 21 is poor.

Further, the reflective material 62 and the surface of the substrate 11 are bonded in the cutout portions 20b, 21b. Accordingly, it is possible to prevent the separation of the reflective material 62 even when the adhesion between the reflective material 62 and the electrode patterns 20, 21 is poor.

Other Embodiments

The present invention is not limited to each of the above-described embodiments but may be embodied as follows. Also in these cases, it is possible to obtain the effects and advantages equal to or better than each of the above-described embodiments.

(A) The number of the through holes 70, 101, 201, 301 constituting each of the hole arrays 72, 72 may be set as appropriate.

(B) The through holes 70, 101, 201, 301 constituting each of the hole arrays 72, 72 are not limited to be arranged at constant intervals but may be arranged at suitable intervals.

(C) The shape of the through holes 70, 101, 201, 301, 401 is not limited to the above shapes (circular holes or elliptical holes) but may be any shape (e.g., square hole or rectangular hole, etc.).

(D) In each of the above embodiments, each of the through holes 70, 101, 201, 301 constituting each of the hole arrays 71, 72 is illustrated to have the same size and shape. However, the size and shape of each of the through holes may be different from each other.

That is, the size and shape of the through holes may be changed in the hole array 71 and the hole array 72. Further, the size and shape of each of the through holes constituting each of the hole arrays 71, 72 may be changed in each of the hole arrays 71, 72.

(E) The sealing frame 60, the sealing material 61 and the reflective material 62 are not limited to the thermosetting resin material. The thermosetting resin material may be replaced by any curable (e.g., photo-curable or reactive-curable, etc.) synthetic resin material.

(F) The LED chips 30 may be connected to the electrode patterns 20 to 24 by a wire bonding, instead of the flip-chip bonding.

(G) The through holes 70, 101, 201, 301 are not limited to a case where a part thereof is covered by the sealing frame 60. For example, the through holes 70, 101, 201, 301 may be entirely covered by the sealing frame 60.

That is, a material of forming the sealing frame 60 may be filled into the entire interior of the through holes, and the surface of the substrate 11 and the sealing frame 60 may be bonded in the entire bottom surface of the through holes.

(H) The number of the LED chips 30 may be set as appropriate.

Further, the LED chips 30 are not limited to be arranged side by side in a row. For example, the LED chips 30 may be arranged side by side in a grid pattern or may be arranged in a distributed manner.

Further, the LED chips 30 may be replaced by any semiconductor light emitting element (e.g., organic EL chip).

(I) The first to fifth embodiments may be combined with the sixth embodiment. The first to fourth and sixth embodiments may be combined with the fifth embodiment. In this case, the effects and advantages of the combined embodiments can be entirely obtained or synergy effects can be obtained.

The present invention is not limited to the description of illustrative embodiments and each of the aspects. The present invention also includes various modifications which can be easily conceived by those skilled in the art without departing from the description of the claims. The contents of publications mentioned in the present specification are incorporated by reference in its entity.

What is claimed is:

1. A light emitting device comprising:
a substrate;
an electrode pattern formed on the substrate;
a light emitting element connected to the electrode pattern;
a ridge-shaped resin covering portion which covers a part of the electrode pattern, and which comprises, in a plan view, a first outer edge portion and a second inner edge portion, the second inner edge portion being adjacent to the first outer edge portion;
a plurality of first through holes and a plurality of second through holes, which are formed to penetrate through the electrode pattern such that the substrate is exposed from bottoms of the first though holes and the second though holes;
a first hole array comprising the first through holes arranged along the first outer edge portion; and
a second hole array comprising the second through holes arranged along the second inner edge portion,
wherein the first outer edge portion covers at least a part of each of the first through holes constituting the first hole array, and is bonded to the substrate in an inside of the first through holes,
wherein the second inner edge portion covers at least a part of each of the second through holes constituting the second hole array, and is bonded to the substrate in an inside of the second through holes,
wherein the first hole array is disposed on an outer side of the ridge-shaped resin covering portion and the second hole array is disposed on an inner side of the ridge-shaped resin covering portion,
wherein centers of the first through holes are substantially aligned with the first outer edge portion,
wherein centers of the second through holes are substantially aligned with the second inner edge portion,
wherein a first line passing through the centers of the first through holes in the first hole array is off-set in a second direction from a second line passing through the centers of the second through holes in the second hole array,
wherein the ridge-shaped resin covering portion includes:
a pair of long sides arranged along the second direction; and
a pair of short sides arranged along a first direction which is substantially perpendicular to the second direction
wherein the first hole array comprising the first through holes overlaps with a first short side of the pair of short sides, and
wherein the second hole array comprising the second through holes overlaps with the first short side of the pair of short sides,
further comprising a center line bisecting the substrate, the center line being parallel to the pair of short sides and not being between the first and second lines, and
wherein the first direction is parallel to the center line bisecting the substrate.

2. The light emitting device according to claim 1, wherein the first through holes constituting the first hole array and the second through holes constituting the second hole array are arranged at intervals with respect to the second direction of the ridge-shaped resin covering portion.

3. The light emitting device according to claim 1, wherein the first through holes constituting the first hole array are arranged at equal intervals in the first direction; and
the second through holes constituting the second hole array are arranged at equal intervals in the first direction.

4. The light emitting device according to claim 1, wherein the resin covering portion comprises a sealing frame which surrounds the light emitting element on the substrate.

5. The light emitting device according to claim 4, further comprising:
a reflective material with which a region surrounded by the sealing frame is filled so as to seal the light emitting element; and
at least one third through hole formed to penetrate through the electrode pattern such that the substrate is exposed from a bottom of the third through hole,
wherein the reflective material covers the third through hole, and is bonded to the substrate in an inside of the third through hole.

6. The light emitting device according to claim 1, wherein each of the first through holes and the second through holes comprises a hole selected from a group consisting of a circular hole, an elliptical hole and a square hole.

7. The light emitting device according to claim 1, the light emitting device further comprising:
a third hole array comprising third through holes overlapping with a second short side of the pair of short sides; and
a fourth hole array comprising fourth through holes overlapping with the second short side of the pair of short sides.

8. The light emitting device according to claim 1, wherein the first hole array and the second hole array are each arranged along a same portion of the ridge-shaped resin covering portion.

9. The light emitting device according to claim 1, wherein a number of first through holes in the first hole array is less than a number of second through holes in the second hole array.

10. The light emitting device according to claim 1, wherein a width between a center of one of the first through holes and a center of one of the second through holes is substantially equal to a width of a side of the ridge-shaped resin covering portion.

11. The light emitting device according to claim 1, wherein a distance between an edge of the substrate parallel to the first direction and a center of a first through hole of the first through holes nearest the edge of the substrate is greater than a distance between the edge of the substrate parallel to the first direction and a center of a second through hole of the second through holes nearest the edge of the substrate.

12. The light emitting device according to claim 1, wherein a portion of the substrate is disposed under the ridge-shaped resin between the first through holes and the second through holes in the second direction.

13. The light emitting device according to claim 1, wherein a portion of the substrate is disposed between the first through holes and the second through holes in the second direction.

* * * * *